US011346908B2

(12) United States Patent
Yu et al.

(10) Patent No.: US 11,346,908 B2
(45) Date of Patent: May 31, 2022

(54) SOLVENT NUCLEAR MAGNETIC RESONANCE FOR NONINVASIVE INSPECTION OF PARTICLE-CONTAINING PRODUCTS (71) Applicant: UNIVERSITY OF MARYLAND, BALTIMORE, Baltimore, MD (US)

(72) Inventors: Yihua Yu, Ellicott City, MD (US); Marc Taraban, North Potomac, MD (US)

(73) Assignee: UNIVERSITY OF MARYLAND, BALTIMORE, Baltimore, MD (US)

( * ) Notice: Subject to any disclaimer, the term of this patent is extended or adjusted under 35 U.S.C. 154(b) by 0 days.

(21) Appl. No.: 16/465,290

(22) PCT Filed: Dec. 1, 2017

(86) PCT No.: PCT/US2017/064211
§ 371 (c)(1),
(2) Date: May 30, 2019

(87) PCT Pub. No.: WO2018/102681
PCT Pub. Date: Jun. 7, 2018

(65) Prior Publication Data
US 2019/0391218 A1    Dec. 26, 2019

Related U.S. Application Data (60) Provisional application No. 62/429,360, filed on Dec. 2, 2016.

(51) Int. Cl.
*G01R 33/44* (2006.01)
*G01N 24/08* (2006.01)

(52) U.S. Cl.
CPC ........... *G01R 33/448* (2013.01); *G01N 24/08* (2013.01)

(58) Field of Classification Search
CPC .............................. G01R 33/448; G01N 24/08
USPC ......................................................... 324/309
See application file for complete search history.

(56) References Cited

U.S. PATENT DOCUMENTS

| 8,314,618 | B2 | 11/2012 | Bieri et al. |
| 8,854,038 | B2 | 10/2014 | Hernando et al. |
| 8,862,407 | B2 | 10/2014 | Chugunov et al. |
| 9,194,925 | B2 | 11/2015 | Zhong et al. |
| 10,267,754 | B2 | 4/2019 | Yu et al. |
| 2004/0090231 | A1 | 5/2004 | Augustine et al. |
| 2005/0287527 | A1 | 12/2005 | Ni et al. |

(Continued)

OTHER PUBLICATIONS

Partial Extended European Search Report, European Patent Application No. 17877066.5 dated Jul. 3, 2020.

(Continued)

*Primary Examiner* — Farhana A Hoque
(74) *Attorney, Agent, or Firm* — Tristan A. Fuierer; Casimir Jones, S.C.

(57) ABSTRACT

The present invention generally relates to a method of using the transverse relaxation rates ($R_2$) of solvent NMR signal to noninvasively assess particle-containing products formulated as suspension or emulsion in solvent(s). Anomaly in released products and differences between innovator and follow-on products can be distinguished by this technology nondestructively without the vial or container being opened or protective seal compromised (i.e., broken).

12 Claims, 7 Drawing Sheets

(56) References Cited

U.S. PATENT DOCUMENTS

| | | |
|---|---|---|
| 2006/0269965 A1 | 11/2006 | Josephson |
| 2007/0116602 A1 | 5/2007 | Lee |
| 2010/0047180 A1 | 2/2010 | Zeng et al. |
| 2010/0072994 A1 | 3/2010 | Lee et al. |
| 2010/0278829 A1 | 11/2010 | Edwards, III et al. |
| 2011/0124744 A1 | 5/2011 | Lee et al. |
| 2012/0100546 A1 | 4/2012 | Lowery, Jr. et al. |
| 2012/0164644 A1 | 6/2012 | Neely et al. |
| 2013/0244238 A1 | 9/2013 | Neely et al. |
| 2013/0265054 A1* | 10/2013 | Lowery, Jr. .......... G01R 33/281 324/319 |
| 2016/0047761 A1 | 2/2016 | Yu et al. |
| 2019/0293579 A1 | 9/2019 | Yu et al. |

OTHER PUBLICATIONS

Taraban, Marc B., et al.; "Noninvasice detection of nanoparticle clustering by water proton NMR," Transl. Mater. Res., 2017, vol. 4, 025002.

International Search Report and Written Opinion, dated Feb. 20, 2018.

Ku, Bruce, et al.; "Water Proton NMR for Noninvasive Chemical Analysis and Drug Product Inspection," American Pharmaceutical Review, 2017.

Taraban, Marc B., et al.; "Water Proton NMR: A Tool for Protein Aggregation Characterization," Anal. Chem., 2017, pp. 5494-5502, vol. 89; DOI: 10.1021/acs.analchem.7b00464.

Bouchoux, Antoine et al. "Molecular Mobility in Dense Protein Systems: An Investigation through 1 H NMR Relaxometry and Diffusometry." Journal of Physical Chemistry Part B: Condensed Matter, Materials, Surfaces, Interfaces & Biophysical, 2012 (116) (38), 11744-11753.

Daskiewicz, O. et al. "Proton Magnetic Relaxation and Protein Hydration." Nature, 1963 (200) (4910), 1006-1007.

Mahler, Hans-Christian et al. "Protein aggregation: Pathways, induction factors and analysis." Journal of Pharmaceutical Sciences, 2009 (98) (9), 2909-2925.

Baroni, et al "Relaxometric Characterization of Balsamic Vinegar." meeting abstract 6th Conference on Field Cycling NMR Relaxometry Turin (Italy) Jun. 4, 2009.

Bloembergen, N. et al. "Relaxation Effects in Nuclear Magnetic Resonance Absorption." Phys. Rev. 1948, 73, 679-712.

Dalvit, C. et al. "High-Throughput NMR-Based Screening with Competition Binding Experiments." J. Am. Chem. Soc. 2002, 124, 7702-7709.

Fanali, G. et al. "Human serum albumin: From bench to bedside." Mol. Asp. Med. 2012, 33, 209-290.

Korzhnev, D. et al. "Probing Invisible, Low-Populated States of Protein Molecules by Relaxation Dispersion NMR Spectroscopy: An Application to Protein Folding " Acc. Chem. Res., 2008, 41, 442-451.

Krayukhina, E. et al. "Aggregation analysis of pharmaceutical human immunoglobulin preparations using size-exclusion chromatography and analytical ultracentrifugation sedimentation velocity." J. Biosci. Bioeng. 2012, 115, 104-110.

Mao, X. et al. "Understanding Radiation Damping in a Simple Way." Concepts Magn. Reson. 1997, 9, 173.

Metz, H. et al. "Benchtop-NMR and MRI—A new analytical tool in drug delivery research." Int. J. Pharm. 2008, 364, 170-175.

Dliva, A. et al. "Influence of temperature and shaking on stability of insulin preparations: degradation kinetics." Int. J. Pharm. 1996, 143, 163-170.

Saso, L. et al. "Effect of Selected Substances on Heat-Induced Aggregation of Albumin, IgG and Lysozyme." Res. Commun. Pathol. Pharmacol. 1998, 102, 15-28.

Notice of Allowance for U.S. Appl. No. 16/369,534.

* cited by examiner

SOLVENT NUCLEAR MAGNETIC RESONANCE FOR NONINVASIVE INSPECTION OF PARTICLE-CONTAINING PRODUCTS

CROSS REFERENCE TO RELATED APPLICATION

This application is filed under the provisions of 35 U.S.C. § 371 and claims the priority of International Patent Application No. PCT/US2017/064211 filed on 1 Dec. 2017 entitled "SOLVENT NUCLEAR MAGNETIC RESONANCE FOR NONINVASIVE INSPECTION OF PARTICLE-CONTAINING PRODUCTS" in the name of Yihua Y U, et al., which claims priority to U.S. Provisional Patent Application No. 62/429,360, filed on Dec. 2, 2016, both of which are hereby incorporated by reference herein for all purposes.

FIELD

The present invention relates to methods for noninvasive quality control of particle products, including both non-pharmaceutical and pharmaceutical products, using solvent nuclear magnetic resonance (NMR). The particles can range in size from nanoparticles to micron-size particles.

DESCRIPTION OF THE RELATED ART

Nanoparticles (NPs) are the building blocks of nanotechnology with wide application prospects in engineering, chemistry, biology and medicine. As nanoparticles transition from research subjects to commercial products, the issue of NP product quality becomes ever more pressing. In general, NPs have much larger surface area per unit volume or mass than other materials, a feature that greatly enhances the potential of inter-particle interactions. As a result, clustering of NPs, intentional or unintentional, may occur. Indeed, new application prospects of NPs are opened up by their propensity to form clusters, which may have collective properties that are absent in individual NPs [1]. For example, intended or controlled clustering of NPs used in gas sensors ensures high quality and functionality of toxic gas detectors [2]. On the other hand, unintended or uncontrolled clustering of NPs may compromise both the safety and efficacy of NP-based pharmaceuticals [3].

Knowing that NPs have a propensity to cluster, with a potential impact of said clustering on the performance of NP products, it is necessary to detect unintended clustering of NPs in commercial products [12]. Current analytical techniques for NP characterization, indispensable tools for research, are ill-suited for inspecting NP products by end users, largely due to their complexity and intrusiveness. For example, radiation scattering techniques, such as dynamic light scattering (DLS) and small-angle X-ray and neutron scattering (SAXS and SANS), have been traditionally used for characterizing NP size and clustering [13]. Disadvantageously, the intrusiveness of the DLS and SAXS analyses render the NP-containing product unusable even if the results indicate it has acceptable quality. Imaging techniques, such as scanning electron microscopy (SEM) and 3D fluorescence anisotropy mapping, can provide data on both NP size and morphology, however, the imaging techniques have severe limitations as well. They often require highly expensive and specialized instruments for data acquisition and complex software for data analysis [1, 14]. For example, the use of SEM to obtain the size distributions of NP products requires the development and application of complex software of image analysis to count the assemblies and to derive their shape pattern and cluster sizes [15]. Further, these analytical techniques involve extensive and elaborate sample preparation procedures that may significantly perturb the product, thereby making the inspection results unreliable. For example, electron microscopy requires drying or freezing of the sample while fluorescence mapping involves labeling NPs with fluorescent dyes [16]. Such procedures might disrupt or induce NP clustering, depending on the technique and the particular NP. Finally, for NP-based pharmaceuticals, the inspection process should not tamper with the drug product. Unfortunately, all known analytical techniques for NP characterization require opening a sealed product and transferring its content into some device for analysis.

Recent breakthrough developments in the instrumentation for nuclear magnetic resonance (NMR) spectroscopy and imaging have opened up opportunities to design novel nondestructive analytical techniques for the nanoparticle industry. The analytical procedures become significantly faster with the application of commercially available computer-controlled NMR autosamplers. Of special importance was the appearance of commercially available, relatively inexpensive benchtop NMR and magnetic resonance imaging (MRI) instruments and relaxometers [17]. These instruments have already demonstrated their extreme versatility in the chemical and food industry, and very recently, in the monitoring of drug delivery steps in vitro, for example, the hydration and swelling of controlled release tablets [17]. Benchtop NMR instruments enable highly accurate measurements of nuclear spin relaxation times $T_1$ and $T_2$. Moreover, most of these instruments have a permanent or electronically cooled magnet with the variable bore from 10 mm to 45 mm and even larger which provides a great flexibility in the nonintrusive measurements of vials of various sizes.

Aside from clustering, another aspect of nanoparticle products is their complexity, especially pharmaceutical products, also known as nanomedicines, nanodrugs, nanopharmaceuticals, although the actual size of the particles might extend to the micron-size range. From the regulatory standpoint, nanomedicines are considered non-biological complex drugs (NBCDs). The complexity of such drugs poses a special challenge to the approval of their generic versions. A generic NBCD cannot be made identical to the innovator NBCD and hence is regarded as nano-similars (akin to biosimilars) [4, 5]. Currently regulation on NBCDs is considered inadequate to the point that the US Congress House Committee on Energy and Commerce on Dec. 10, 2015 send a letter to the Comptroller General of the United States requesting "the Government Accountability Office (GAO) conduct a study to assess the Food and Drug Administration's (FDA) regulatory pathway for reviewing generic versions of non-biological complex drugs (NBCDs)."

At issue is that in vitro physicochemical characterizations often fail to discern subtle but biologically-relevant differences between innovator and generic NBCDs. The consequence is that drugs deemed pharmaceutically equivalent may turn out to be non-equivalent biologically and therapeutically [6, 7, 8]. This inability to detect subtle differences between innovator and generic NBCDs may harm patients and therefore poses a huge regulatory challenge.

Particularly challenging to the characterization of NBCDs is that these drugs are physically fragile and current physicochemical characterizations techniques are often very harsh, potentially alter or even destruct the nanomedicine under analysis [9, 10, 11]. In this regard, a noninvasive technology that can detect subtle differences between innovator and generic NBCDs will be highly valuable to both regulators and manufacturers of NBCDs. The current inventors demonstrate that solvent NMR is one such technology.

For example, FERRLECIT®, the innovator sodium ferric gluconate, was approved in February 1999 by the FDA. NULECIT™, the generic sodium ferric gluconate, was approved in March 2011 by the FDA. In July 2013, the FDA published a solicitation entitled "Evaluate the therapeutic equivalence of generic sodium ferric gluconate iron complex NULECIT™ and its RLD FERRLECIT®" [26]. As the title suggests, the objective of this solicitation is to support research to compare the therapeutic equivalence of innovator and generic sodium ferric gluconate. The fact that the therapeutic equivalence is the subject of an FDA solicitation two years after the approval of the generic drug highlights the uncertainty and challenges facing the production and regulation of NBCDs.

There is a need for a fast and reliable technique which would allow one to nondestructively measure uncontrolled (or controlled) nanoparticle, and micron-sized particle, clustering and still retain its usability. Towards that end, the present invention relates to a method of using the transverse relaxation rate of the solvent NMR signal, e.g., $R_2(^1H_2O)$, as an indicator of the uncontrolled (or controlled) clustering of particle-containing compositions. Advantageously, the method described herein is not particle specific, is easy to use, is nondestructive, and fast.

SUMMARY

The present invention generally relates to a method of using NMR relaxation rates, specifically the transverse relaxation rate constant $R_2$ of solvent molecules (e.g., water), as an indicator of the extent of clustering in particle-containing products, e.g., nanoparticle-containing products or micron-sized particle-containing products.

In one aspect, a method of determining the acceptable level of clustering of particles in a particle-containing product, said method comprising: measuring the transverse relaxation rate of solvent $R_{2,m}$ in the particle-containing product; and determining the extent of clustering by comparing the measured $R_{2,m}$ to a control transverse relaxation rate of solvent $R_{2,c}$, wherein the control $R_{2,m}$ represents a range of acceptable clustering, wherein when the measured $R_{2,m}$ is inside the control $R_{2,c}$ range, the extent of clustering is acceptable.

In another aspect of the present invention, a method to noninvasively reveal the physico-chemical differences between a first iron-containing product and a second iron-containing product, said method comprising: (i) measuring the transverse relaxation rate of solvent $R_{2,first}$ in the first iron-containing product; (ii) measuring the transverse relaxation rate $R_{2,second}$ of solvent in the second iron-containing product; and (iii) comparing the first iron-containing product $R_{2,first}$ with the second iron-containing product $R_{2,second}$, wherein a difference between the first iron-containing product $R_{2,first}$ and the second iron-containing product $R_{2,second}$ corresponds to a difference in the physico-chemical makeup between the first and the second iron-containing products.

In yet another aspect, a method of determining a control range of the transverse relaxation rate of solvent $R_{2,c}$ for a particle in a particle-containing product is described, said method comprising: preparing a series of two, three, four, five, six, seven, eight, or more, particle-containing formulations, each comprising a different particle size; measuring the transverse relaxation rate of solvent $R_{2,m}$ of the particles in the two, three, four, five, six, seven, eight, or more, particle-containing formulations; and plotting the transverse relaxation rate of solvent $R_{2,m}$ of the particles relative to the particle size of each particle-containing formulation,
wherein the control range of the transverse relaxation rate of solvent $R_{2,c}$ for the particle in the particle-containing product is greater than some percentage, less than some percentage, or both, of the transverse relaxation rate of solvent $R_{2,m}$ of the formulation with corresponding size and acceptable clustering.

Other aspects, features and advantages of the invention will be more fully apparent from the ensuing disclosure and appended claims.

DETAILED DESCRIPTION, AND PREFERRED EMBODIMENTS THEREOF

The present invention generally relates to a method of using NMR relaxation rates, specifically the transverse relaxation rate constant $R_2$ of solvent molecules (e.g., water), as an indicator of the extent of clustering in particle-containing products, e.g., nanoparticle-containing products or micron-sized particle-containing products.

Advantageously, the method described herein is a reliable and simple method to detect the extent of clustering and hence, product quality, and has application as a quality control tool for any field utilizing particles, e.g., nanoparticles and/or micron-sized particles. The method enables the non-destructive determination of the extent of clustering of particles, including nanoparticles, formulated as aqueous suspensions, without opening the vial or storage container, by measuring the transverse nuclear spin relaxation rate constant, $R_2$, of a solvent, e.g., water. The $R_2$ constant of a particle-containing product, as well an acceptable range of $R_2$ constants of said particle-containing product (i.e., an acceptable range of clustering), can be determined by the manufacturer. Thereafter, as new batches of particle-containing products are prepared, the $R_2$ constant of each new batch can be measured by the manufacturer to confirm that the extent of particle clustering is within the acceptable range before releasing for sale and purchase. Further, the $R_2$ constant can be measured by the purchaser/user before use to confirm that the extent of particle clustering remains within an acceptable range, pursuant to the manufacturer's guidelines. Accordingly, this method redefines the conventional methods of evaluating the shelf-life of particles by assessing the extent of clustering of particles in the aqueous suspensions for each vial or storage container.

The present inventors have previously shown that the transverse relaxation rate of the water proton NMR signal, $R_2(^1H_2O)$, can be used to monitor solute association in aqueous solutions, such as protein aggregation [18] and surfactant micellization [19]. A notable distinction of this approach is that solute association can be detected through the solvent NMR signal. This brings tremendous benefit as the solvent NMR signal is $10^5$-$10^6$ times stronger than the solute NMR signal.

The mechanisms of solvent $R_2$ sensitivity towards protein aggregation and particle clustering are very different. In the case of aggregation, $R_2$ is mostly sensitive because of proton exchange between solvent molecules and hydrophilic protons of the protein, since in the protein aggregate different numbers of such protons are accessible for the solvent relative to nonaggregated protein monomers. In clustering, solvent molecules trapped in the restricted compartments inside the clusters of particles have different diffusion properties and local magnetic fields as compared to bulk/free solvent molecules, thus resulting in spin de-coherence and a faster relaxation $R_2$. As defined herein, "clustering" of particles is understood to be a phase separation of the particles from the solvent as a result of particle assembly which, unlike aggregation, is not driven by hydrophobic and/or hydrophilic interactions.

As defined herein, a "particle" corresponds to particles between about 1 nanometer and 10 microns in diameter, including particles that would be traditionally characterized as nanoparticles (e.g., about 1 nm to about 100 nm) and particles that would be traditionally characterized as micron-sized (e.g., up to about 10 microns). Particle size ranges relevant to the present invention include about 10 nm to about 100 nm, about 10 nm to about 500 nm, about 10 nm to about 1000 nm, about 100 nm to about 500 nm, about 500 nm to about 1000 nm, about 1000 nm to about 5000 nm (5 microns), and about 1000 nm to about 10000 nm (10 microns). A person with an ordinary skill in the art will readily understand that the above particle size range is intended to be unlimited and could be extended to larger sizes. Also, it should be appreciated that the particles can be any shape including spherical, and can be substantially symmetrical or asymmetrical. Further the material of the particles can be organic, inorganic, organometallic, proteinaceous, metallic, polymeric, or any combination of each of these. The particles can be functionalized or non-functionalized.

As defined herein, the "particle-containing product" includes a product with nano- and micron-sized particles suspended in a solvent or a mixture of solvents. The particle-containing product can further comprise at least one surfactant, at least one water-soluble organic solvent, at least one dispersant, at least one biocide, at least one buffering agent, at least one pH adjusting agent (e.g., acids and/or bases), or any combination thereof, as readily determined by the person skilled in the art.

As defined herein, a "vial" corresponds to a small glass (optionally, plastic, ceramic, etc., anything non-magnetic metal) vessel, bottle or ampoule used to store the biopharmaceutical. The vial can have a screw top, a top that is closed using a cork or plastic stopper, a crimp vial (closed with a rubber stopper and a metal cap), a flip-top or snap cap. The vial can be tubular, or have a bottle-like shape with a neck. Other types and shapes of vials used to store particles as well as caps are readily understood by the person skilled in the art. The vials can be optically transparent or not optically transparent. There is no need to peel off any label on the vial, whether the label is transparent or not.

As defined herein, a "non-destructive" measurement is defined as a measurement performed without opening the vial or otherwise accessing the contents of the vial (for example by withdrawing a portion through a rubber gasket). Moreover, a non-destructive measurement means that no additives or probes or the like are added to the vial prior to the measurement of the transverse relaxation rate of water $R_2$ in the particle-containing product. Non-destructive also means that there is no need to make the vials transparent and no need to peel off any labels on the vials.

As defined herein, a "control range" corresponds to a range, i.e., ceiling to floor, of the transverse nuclear spin relaxation rate constants, $R_2$, of a solvent where the clustering of particles is acceptable.

It is understood that $R_{2,c}$, for the purposes of the present invention, is the control range and is determined by the formula $R_{2,c}=R_{2,max}-R_{2,min}$, wherein $R_{2,max}$ is the maximum value of the transverse relaxation rate of solvent where the clustering of the particular particles is not disadvantageous to the use of the particle-containing product, i.e., the maximum acceptable clustering, and $R_{2,min}$ is the minimum value of the transverse relaxation rate of solvent where the clustering of the particular particles is not disadvantageous to the use of the particle-containing product, i.e., minimum acceptable clustering. It should be appreciated that the value of $R_{2,min}$ can be zero when clustering of particles is not favored. Analogously, the value of $R_{2,max}$ can be the maximum possible value when clustering of particles is favored.

The present inventors have surprisingly discovered that solvent NMR can detect uncontrolled clustering of particles, including nanoparticles, formulated as suspensions. Without being bound by theory, it is thought that the clustering of particles causes the compartmentalization of solvent molecules, leading to accelerated proton spin de-coherence, and hence, much faster solvent transverse relaxation rates. The results suggest that both high and low field solvent NMR can be used to noninvasively inspect particle-containing products by commercial end users and researchers. In addition to being noninvasive, additional advantages of low field solvent NMR includes low cost instrumentation (e.g., a desktop NMR), simple and rapid data acquisition and analysis, and minimal technical expertise requirement whereby the results are readily available within <5 min. It should be appreciated that the measurements can occur destructively as well, whereby the vial is opened. For example, an alternative analytical method that can be used is ultra-small-angle X-ray scattering (USAXS) or high field NMR. Although more informative than solvent NMR in that it can provide data on actual particle size, USAXS can be much more demanding in terms of instrument cost, experimental procedure, and personnel training. With USAXS, sample setting, adjustment and data collection can be done in about 10-30 minutes, however, the data processing requires complex software and expert skills, and sometimes hours before a reliable data fit can be obtained. Hence, these two techniques, solvent NMR and USAXS, play complementary functions in particle quality control: solvent NMR for screening defective products by end users and USAXS for in-depth analysis by trained personnel. For example, the manufacturer can use USAXS or DLS to ascertain that a given vial of product has minimal or negligible clustering and the manufacturer and the user can use non-invasive solvent NMR measurements to verify that the particle sample has been properly formulated and/or has not undergone unacceptable clustering upon transport and/or storage.

It is further noted that the methods described herein do not require the determination of the relaxation dispersion profile $R(\omega)$ of any particle-containing products.

Accordingly, in a first aspect, a method of determining the acceptable level of clustering of particles in a particle-containing product is described, said method comprising measuring the transverse relaxation rate of solvent, $R_{2,m}$, in the particle-containing product, and determining the extent of clustering by comparing the measured $R_{2,m}$ to a control transverse relaxation rate of solvent, $R_{2,c}$, wherein the control $R_{2,c}$ represents a range of acceptable clustering, wherein when the measured $R_{2,m}$ is within the control $R_{2,c}$ range, the extent of clustering is acceptable. In one embodiment, the particles in the particle-containing product are nanoparticles. The transverse relaxation rate of solvent $R_2$ can be determined using solvent NMR, preferably low field solvent NMR. The measuring of the transverse relaxation rate of solvent $R_2$ in the particle-containing product can be done non-invasively in a vial. The control $R_{2,c}$ range, at a specified temperature, can be measured by the manufacturer and the result listed in the package insert of the particle-containing product. Preferably $R_{2,m}$ is measured at the same temperature as $R_{2,c}$. The distributor or purchaser can then use NMR, e.g., benchtop or handheld, to measure $R_{2,m}$ at the specified temperature and compare it with the control $R_{2,c}$ range listed in the package insert before distribution or usage. If the extent of clustering is outside of the acceptable range of the clustering, and as such is unintended, the particle-containing product should not be distributed or used.

In one embodiment of the first aspect, a method of determining the acceptable level of clustering of particles in a particle-containing product is described, said method comprising measuring the transverse relaxation rate of water, $R_{2,m}$, in the particle-containing product, and determining the extent of clustering by comparing the measured $R_{2,m}$ to a control transverse relaxation rate of water $R_{2,c}$, wherein the control $R_{2,c}$ is a range of acceptable clustering, wherein when the measured $R_{2,m}$ is within the control $R_{2,c}$ range, the extent of clustering is acceptable. In one embodiment, the particles in the particle-containing product are nanoparticles. The transverse relaxation rate of water $R_2$ can be determined using water NMR, preferably low field water NMR. The measuring of the transverse relaxation rate of water $R_2$ in the particle-containing product can be done non-invasively in a vial. The control $R_{2,c}$ range, at a specified temperature, can be measured by the manufacturer and the result listed in the package insert of the particle-containing product. Preferably $R_{2,m}$ is measured at the same temperature as $R_{2,c}$. The distributor or purchaser can then use NMR, e.g., benchtop or handheld, to measure $R_{2,m}$ at the specified temperature and compare it with the control $R_{2,c}$ range listed in the package insert before distribution or usage. If the extent of clustering is outside of the acceptable range of the clustering, and as such is unintended, the particle-containing product should not be distributed or used.

"Unacceptable clustering" or "unintended clustering" or an anomaly can be the result of at least one of (i) improper formulations, e.g., using the wrong chemical components or incorrect dilutions or contamination, (ii) the effect of temperature fluctuations on the particle-containing product, (iii) pH changes, (iv) vigorous shaking during transportation; (v) freezing; and (vi) unwanted functional groups on the surface of particles.

"Acceptable clustering" or "intended clustering" corresponds to a particle-containing product that can be sold and used as intended. In other words, the particle-containing product with acceptable clustering can be sold under the existing trademark, administered to a patient (human or other animal), released into the environment, or verified as being nano-similar to an innovator NBCD.

The method described herein is fast and reliable and allows the user to nondestructively measure the extent of clustering of the particle-containing product and still retain its usability if minimal or negligible clustering is desired and detected. The method is not particle specific and is easy to use. It should also be appreciated that the method of the first aspect can be likewise used to detect the absence of desired clustering of particles, for example, when clustering is necessary in drug delivery formulations to encapsulate a drug into nanoparticle clusters, or in nanosensors, when the sensor/probe molecule should be incorporated into nanoparticle cluster. The method of the first aspect can thus be used to determine uncontrolled clustering when clustering is not favored or controlled clustering when clustering is favored.

In practice, the standard for clustering in the particle-containing sample should be determined by the manufacturer. The manufacturer can provide the acceptable $R_{2,c}$ value, i.e., a control range, at a given temperature (e.g., 25° C.) and magnetic field strength (e.g., 0.5 T). The user will then measure the $R_{2,m}$ of solvent of the particle-containing product at the same temperature and magnetic field strength and compare the measured $R_{2,m}$ value with the control $R_{2,c}$, as understood by the person skilled in the art.

It should be appreciated by the person skilled in the art that the methods described herein can be used to measure the extent of clustering of particles in a particle-containing product during pre-formulation, formulation, production, or post-production.

In a second aspect, a method of determining a control range of the transverse relaxation rate of solvent $R_{2,c}$ (i.e., the control $R_2$ range) for a particle in a particle-containing product is described, said method comprising:
preparing a series of two, three, four, five, six, seven, eight, or more, particle-containing formulations, each comprising a different particle size;
measuring the transverse relaxation rate of solvent $R_{2,m}$ of the particles in the two, three, four, five, six, seven, eight, or more, particle-containing formulations; and plotting the transverse relaxation rate of solvent $R_{2,m}$ of the particles relative to the particle size of each particle-containing formulation, wherein the control range of the transverse relaxation rate of solvent $R_{2,c}$ for the particle in the particle-containing product is greater than some percentage, less than some percentage, or both, of the transverse relaxation rate of solvent $R_{2,m}$ of the formulation with corresponding size and acceptable clustering.

In the second aspect, the two, three, four, five, six, seven, eight, or more, formulations comprising the particles have been determined as having acceptable clustering using an analytical technique such as ultra-small angle X-ray scattering. Using these predetermined acceptable clustering formulations, the measured transverse relaxation rate of solvent $R_{2,m}$ of the particles could serve as a critical quality indicator of particle clustering. From the deviation between numerical $R_{2,m}$ value for acceptable clustering formulations and the numerical $R_{2,m}$ value for the formulation of unknown quality, one with ordinary skill in the art could easily identify the control range. For example, the control may be in a range of from no more than 5%, 10%, 15%, 20%, 25%, 30%, or 35% of the numerical $R_{2,m}$ value for acceptable clustering formulations to no less than 95%, 90%, 85%, 80%, 75%, 70%, or 65% of the numerical $R_{2,m}$ value for acceptable clustering formulations. The transverse relaxation rate of solvent $R_2$ can be determined using solvent NMR. The measuring of the transverse relaxation rate of solvent $R_{2,m}$ in the particle-containing product can be done non-invasively in a vial. It should also be appreciated that there are other ways to measure the control $R_{2,c}$ range, as readily determined by the person skilled in the art.

A concern associated with follow-on pharmaceuticals is the availability of active species. For example, with iron-containing products, it has been suggested that the labile iron ion content can be higher, or lower, in the follow-on product than the innovator product. Unexpected higher labile iron ion contents can be quite dangerous to the user, possibly resulting in cellular damage. This can be true batch-to-batch for the innovator NBCD or the generic NBCD. Disadvantageously, current in vitro labile determinations perturb the system, which can lead to false negative conclusions that the two drugs have no difference in labile content. The difference in the labile iron ion content is not discovered until in vivo testing.

Accordingly, in a third aspect, a method to noninvasively reveal the physico-chemical differences between a first iron-containing product and a second iron-containing product is described, said method comprising: (i) measuring the transverse relaxation rate of solvent $R_{2,first}$ in the first iron-containing product; (ii) measuring the transverse relaxation rate $R_{2,second}$ of solvent in the second iron-containing product; and (iii) comparing the first iron-containing product $R_{2,first}$ with the second iron-containing product $R_{2,second}$, wherein a difference between the first iron-containing product $R_{2,first}$ and the second iron-containing product $R_{2,second}$ corresponds to a difference in the physico-chemical makeup between the first and the second iron-containing products. The transverse relaxation rate of solvent $R_2$ can be determined using solvent NMR, preferably low field solvent NMR, since this allows to measure the transverse relaxation rate of solvent $R_2$ non-invasively in a vial without opening or sampling the content. If a significant difference of the solvent NMR parameter exists between the first and the second iron-containing product, then the difference in the labile iron ion content between the two drugs can be successfully distinguished without even have the vials opened. In a preferred embodiment, the iron-containing product comprises, consists of, or consists essentially of iron carbohydrates. It should be appreciated that the first and second iron-containing products may be separate batches of the same product. Alternatively, the first and second iron-containing products may be the innovator and the generic, i.e., follow-on, iron-containing product, respectively.

Accordingly, in one embodiment of the third aspect, a method to noninvasively reveal the physico-chemical differences between an innovator iron-containing product and follow-on iron-containing product is described, said method comprising: (i) measuring the transverse relaxation rate of solvent $R_{2,innov}$ in the innovator iron-containing product; (ii) measuring the transverse relaxation rate $R_{2,follow}$ of solvent in the follow-on iron-containing product; and (iii) comparing the innovator iron-containing product $R_{2,innov}$ with the follow-on iron-containing product $R_{2,follow}$, wherein a difference between the innovator iron-containing product $R_{2,innov}$ and the follow-on iron-containing product $R_{2,follow}$ corresponds to a difference in the physico-chemical makeup between the innovator and the follow-on iron-containing product. The transverse relaxation rate of solvent $R_2$ can be determined using solvent NMR, preferably low field solvent NMR, since this allows to measure the transverse relaxation rate of solvent $R_2$ non-invasively in a vial without opening or sampling the content. If a significant difference of the solvent NMR parameter exists between the innovator and the follow-on iron-containing product, then the difference in the labile iron ion content between the two drugs can be successfully distinguished without even have the vials opened. In a preferred embodiment, the iron-containing product comprises, consists of, or consists essentially of iron carbohydrates.

Although not wishing to be bound by theory, it is presumed that the ability to determine a difference in labile iron ion content in the iron-containing products is because iron is paramagnetic and iron molecules/ions are much more effective in relaxing water than diamagnetic molecules/ions. For example, labile iron ion corresponds to iron that is not well encapsulated by the ligand, e.g., carbohydrate, which may mean that the iron is more accessible to water, which would enhance water relaxation. It is believed that a higher labile iron ion content thus results in a higher $R_2$ value. Nonequivalence in $R_2$ is thus indicative of nonequivalent product characteristics between the innovator and the follow-on iron-containing products, or between separate batches, which is relevant to their toxicity. This is important during drug development and prevents costly and potentially harmful clinical trials.

The present inventors have thus disclosed a quality control technology using solvent NMR to noninvasively detect differences in particle-containing products, for example, unexpected anomalies, batch-to-batch variations of the same product; or product-to-product variations of the same type of products, e.g., innovator nanomedicine vs generic nanomedicine.

The features and advantages of the invention are more fully shown by the illustrative examples discussed below.

EXAMPLE 1

The sensitivity of $R_2(^1H_2O)$ relative to the size and cluster of particles formulated as aqueous suspensions was explored. Non-functionalized polystyrene (PS) particles were used as they lack chemical groups that can interact with water molecules and thereby present a rather stringent test on an analytical technique based on the water NMR signal.

It is understood by the person skilled in the art that particles having water interacting groups are even more sensitive to clustering and as such, using particles having no water interacting groups provides a more stringent test of the technique.

Aqueous suspensions of non-functionalized PS particles were purchased from Magsphere, Inc. (Pasadena, Calif.). The PS particles were purchased as 10% w/v suspensions with particles having average diameters of 30 nm, 60 nm, 200 nm, 400 nm, 800 nm, 2 µm, 5 µm, and 10 µm per the manufacturer's specifications. $R_2(^1H_2O)$ of each sample was measured both at 0.47 T (20 MHz resonance frequency) and 9.4 T (400 MHz $^1H$ resonance frequency) magnetic fields using the Carr-Purcell-Meiboom-Gill (CPMG) pulse sequence. Because the 9.4 T measurement required the transfer of the particle suspension into a 3 mm NMR tube, and because the particle suspensions were too viscous, they had to be diluted to effectuate the transfer. Although measurement at 0.47 T does not require transferring the sample to an NMR tube, in order to compare the 0.47 T with the 9.4 T results, all samples were diluted to 5% w/v using 2×PBS buffer (pH 7.4). To alleviate particle sedimentation which was an issue observed especially for larger sizes (800 nm, 2 µm, 5 µm, and 10 µm), prior to NMR data acquisition, each sample was inverted several times to achieve visually more or less homogeneous suspensions.

To measure the transverse relaxation rate constant $R_2$, Carr-Purcell-Meiboom-Gill (CPMG) experiments were used. The transverse relaxation time $T_2$ ($=1/R_2$) value can be extracted by fitting experimental data to Formula (1):

$$I(t)=I_0 \times \exp(-t/T_2) \quad (1)$$

where I(t) is the $^1H_2O$ signal intensity at time t, $I_0$ is the initial $^1H_2O$ signal intensity when t=0, and t is the $T_2$ delay time.

Figure 1A:
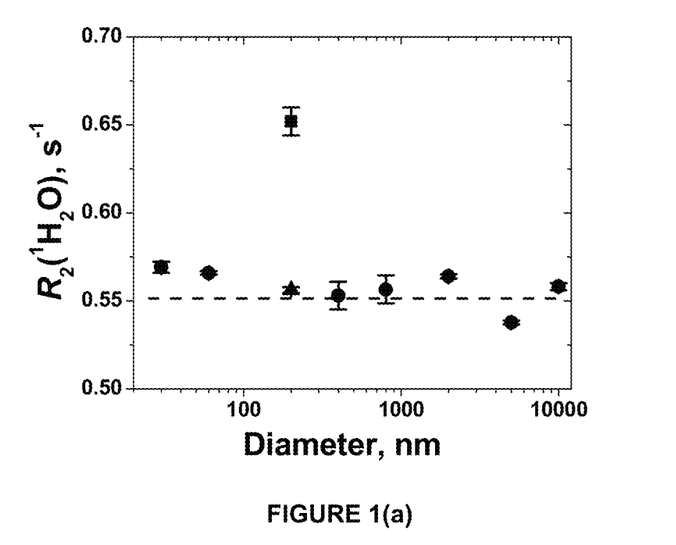
FIG. 1(a) illustrates the transverse relaxation rate of water protons $R_2(^1H_2O)$ measured in aqueous 5% w/v suspensions of polystyrene particles versus their average diameters at 0.47 T.
Figure 1B:
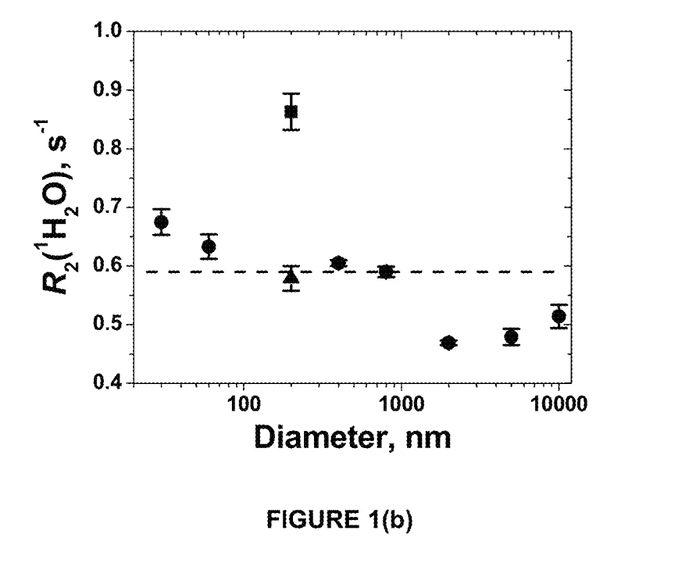
FIG. 1(b) illustrates the transverse relaxation rate of water protons $R_2(^1H_2O)$ measured in aqueous 5% w/v suspensions of polystyrene particles versus their average diameters at 9.4 T.

The transverse relaxation rate of water protons $R_2(^1H_2O)$ measured in aqueous 5% w/v suspensions of PS particles versus their average diameters is shown in FIGS. 1(a) and 1(b), where FIG. 1(a) shows the results at 0.47 T from the CPMG pulse sequence with inter-pulse delay τ=2 ms, where the error bars represent standard deviation of 5 consecutive measurements. FIG. 1(b) shows the results at 9.4 T from the CPMG pulse sequence with inter-pulse delay τ=1 ms, where the error bars represent standard deviation of the CPMG data processing. The dashed line in FIGS. 1(a) and 1(b) represents $R_2(^1H_2O)$ of the blank buffer provided by the vendor (also 1:1 diluted by 2×PBS). As seen in FIGS. 1(a) and (b), $R_2(^1H_2O)$ is essentially independent of particle size at 0.47 T (FIG. 1(a)) but displays a slight decrease with particle size at 9.4 T (FIG. 1(b)). This slight decrease of $R_2(^1H_2O)$ at 9.4 T, observed for the above mentioned larger particle sizes, is most likely due to the sedimentation of the particles during NMR data acquisition. Since data acquisition takes 2 min at 0.47 T using a benchtop NMR spectrometer, but 30 min at 9.4 T using a super-conducting NMR spectrometer, this effect is absent at 0.47 T in an 8 mm sample vial, but present at 9.4 T in a 3 mm NMR tube. This attests to one of the advantages of desktop NMR over super-conducting NMR; such advantages of desktop NMR made possible by using the solvent as the NMR signal source.

Figure 2:
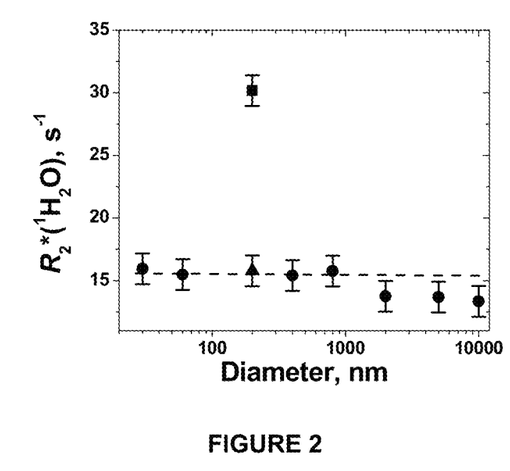
FIG. 2 illustrates the effective transverse relaxation rate of water protons $R_2^*(^1H_2O)$ measured in aqueous 5% w/v suspensions of polystyrene particles versus their average diameters at 9.4 T.

In FIGS. 1(a) and 1(b), the original 200 nm sample (square) is an evident outlier displaying anomalously high $R_2(^1H_2O)$ values at both 0.47 and 9.4 T, respectively. The difference between the original 200 nm sample (square symbol) and other samples was also observed in FIG. 2, which illustrates the so-called 'effective' or 'observed' transverse relaxation rate $R_2*(^1H_2O)$, measured at 9.4 T in aqueous 5% w/v suspension of PS particles versus their average diameters, where the error bars represent standard deviation STD=$\pi D_{res}$, where $D_{res}$ is the digital resolution of the NMR spectra. The dashed line in FIG. 2 represents $R_2(^1H_2O)$ of the blank buffer provided by the vendor (also 1:1 diluted by 2× PBS). Such effective relaxation rate is obtained from the linewidth of the water proton signal as $R_2*(^1H_2O)=\pi v_{1/2}$ ($v_{1/2}$ is the half-maximum peak width). Despite the fact that $R_2*(^1H_2O)$ is to a great extent affected by the external magnetic field inhomogeneity, and hence a rather imprecise measurement of the transverse relaxation rate [20], it still reveals the anomaly of the original 200 nm sample as seen from FIG. 2.

To address this unexpected observation in the original 200 nm sample, it was suggested that the original 200 nm suspension contained insufficient amounts of the surfactant, polysorbate-20, which is added to these PS particle products in very small amounts (<0.2%). A replacement 200 nm sample with proper formulation was therefore requested.

Figure 1C:
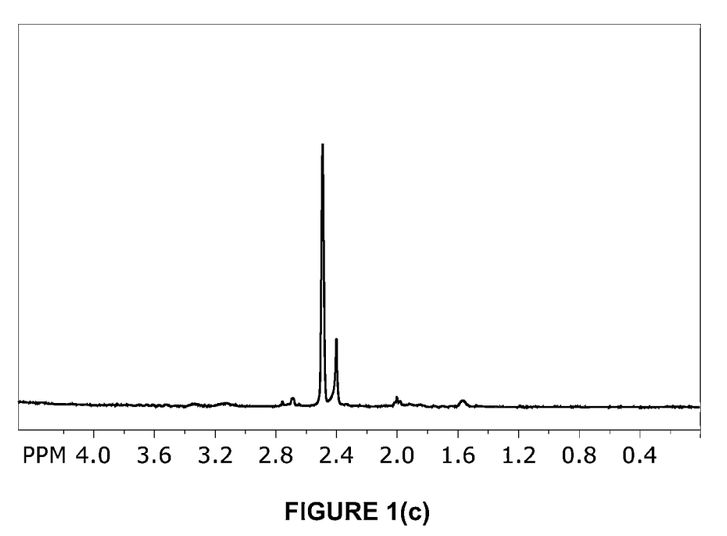
FIG. 1(c) illustrates the $^1H$ 1D chemical shift NMR spectra (9.4 T, 16 transients, aliphatic region shown) for the original 200 nm samples.
Figure 1D:
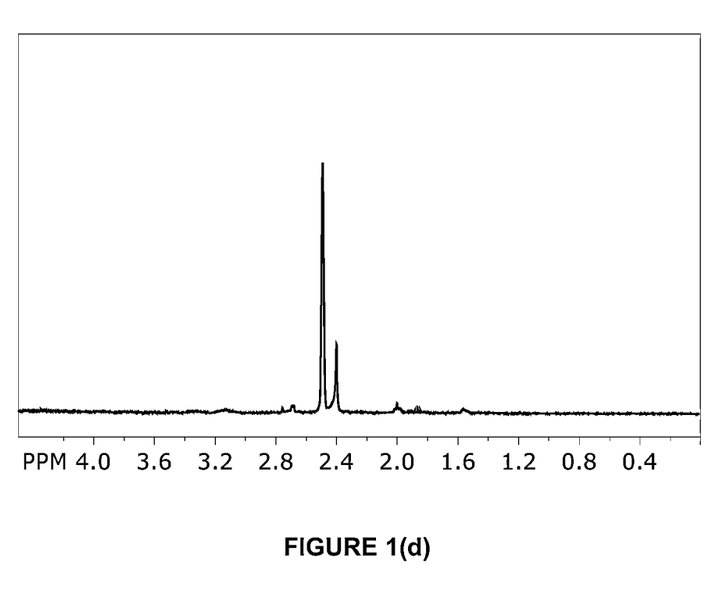
FIG. 1(d) illustrates the $^1H$ 1D chemical shift NMR spectra (9.4 T, 16 transients, aliphatic region shown) for the replacement 200 nm sample.

The original and the replacement 200 nm samples have very similar visual appearance; both are opaque whitish suspensions. Interestingly, the aliphatic regions of the $^1H$ NMR spectra of the two samples are also very similar, as shown in FIGS. 1(c) and 1(d), wherein FIGS. 1(c) and 1(d) correspond to the $^1H$ 1D chemical shift NMR spectra (9.4 T, 16 transients, aliphatic region shown) for the original and replacement 200 nm samples, respectively. FIGS. 1(c) and 1(d) show that conventional solute NMR cannot detect a product defect. In sharp contrast, the solvent NMR parameter $R_2(^1H_2O)$ of the replacement 200 nm sample (triangle symbol) was markedly different than the original 200 nm sample (square symbol) at both 0.47 and 9.4 T (FIGS. 1(a) and 1(b), respectively). Specifically, at both 0.47 and 9.4 T, $R_2(^1H_2O)$ of the replacement 200 nm sample (triangle symbol) is consistent with $R_2(^1H_2O)$ of particles of other sizes. The same result is obtained with the effective transverse relaxation rate $R_2*(^1H_2O)$ (FIG. 2). Hence water proton NMR, through the transverse relaxation rate $R_2(^1H_2O)$, can readily detect anomalies in this type of particle product.

EXAMPLE 2

The insensitivity of water $^1H$ NMR toward the size of these particles while simultaneously detecting an improper particle formulation was considered. The former was not surprising because the PS particles possess no water-interacting chemical groups and have very small magnetic susceptibility contrast with water. That said, the latter was very surprising, especially considering that the solute $^1H$ NMR showed no discernable difference between improperly (original) and properly (replacement) formulated samples. To address this apparent contradiction, ultra-small-angle X-ray scattering (USAXS) was used to analyze both the original and replacement 200 nm particle suspensions. USAXS, rather than DLS, was used because USAXS is not affected by the optical opacity of the sample and can probe structural features in the nanometer- to micrometer-size range revealing the presence of NPs within various size ranges.

Figure 3:
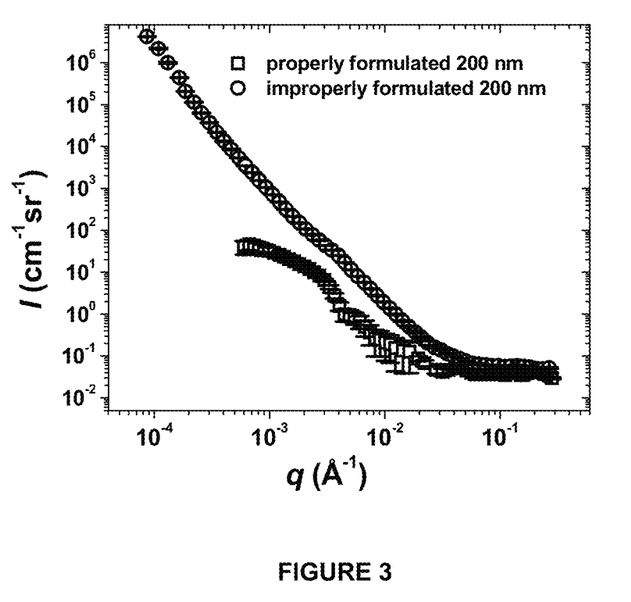
FIG. 3 illustrates the USAXS scattering profiles, I(q) vs. q, of the two 200 nm samples of polystyrene particles covering the range of scattering vector q from ~1 Å$^{-1}$ to ~10$^{-4}$ Å$^{-1}$.

USAXS data was collected on three properly formulated suspensions of 60, 200 and 400 nm particles and the improperly formulated suspension of 200 nm particles (i.e., the original 200 nm formulation). FIG. 3 shows the USAXS scattering profiles, I(q) vs. q, of the two 200 nm samples of PS particles covering the range of scattering vector q from ~1 Å$^{-1}$ to ~10$^{-4}$ Å$^{-1}$ (corresponding to particle diameter range of d~5 Å to ~5 μm, d~2 π/q). The I(q) vs. q scattering profile of the improperly formulated (original) 200 nm sample shows continuing growth of the scattering intensity in the lower q region, consistent with the formation of polydisperse large assemblies of PS particles (FIG. 3, red trace). In contrast, the I(q) vs. q scattering profile of the properly formulated (replacement) 200 nm sample (FIG. 3, green trace) demonstrates more or less plateauing scattering intensity (in log-log coordinates) in the lowest reliable q-region (from $~5\times10^{-4}$ Å$^{-1}$ to $~2\times10^{-3}$ Å$^{-1}$). This behavior is consistent with a monodisperse particles suspension without larger aggregates. The continuing growth of I(q) in the lower q region of the improperly formulated (original) 200 nm sample suggests the formation of particle clusters of different sizes [14].

Figure 4A:
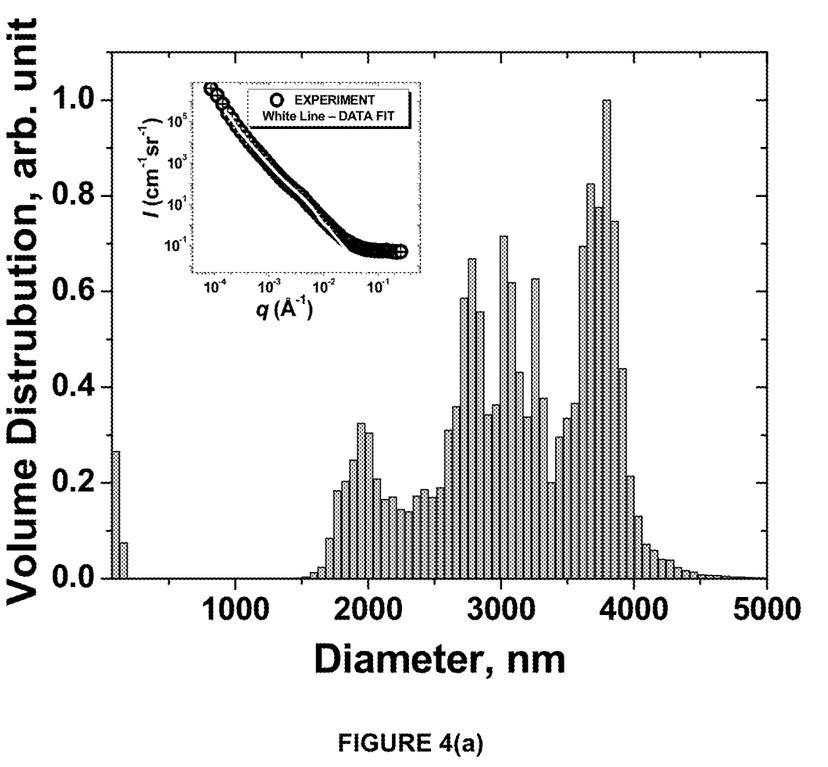
FIG. 4(a) illustrates that the improperly formulated 200 nm suspension contains a mixture of various clusters with a continuum distribution of sizes in the range from 2 μm to 4 μm.
Figure 4B:
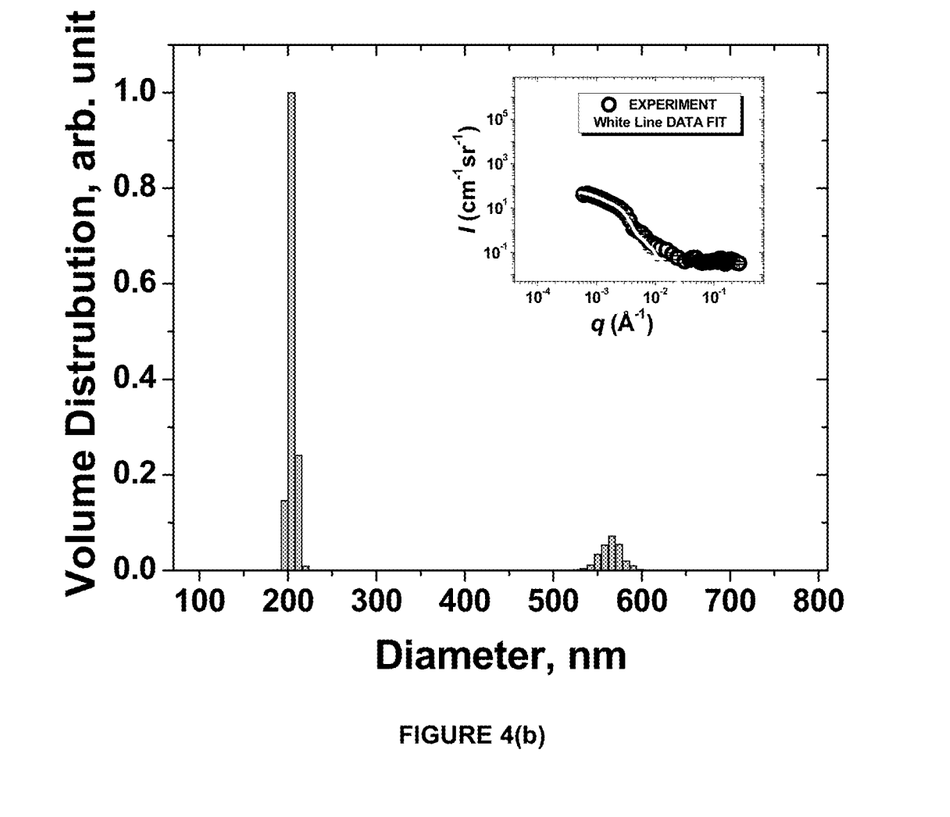
FIG. 4(b) illustrates that the properly formulated 200 nm suspension displays a dominant peak around approximately 200 nm with a few minor, discrete peaks in the size range 500-600 nm.

To derive the size distribution estimates from the above USAXS scattering profiles, Size Distribution function in the Irena 2.60 software was used [21]. FIG. 4(a) shows that the improperly formulated (original) 200 nm suspension contains a mixture of various clusters with a continuum distribution of sizes in the range from 2 μm to 4 μm. In contrast, as seen in FIG. 4(b), the properly formulated (replacement) 200 nm suspension displays a dominant peak around approximately 200 nm with a few minor, discrete peaks in the size range 500-600 nm. For reference, the properly formulated 60 nm and 400 nm suspensions show similar discrete size distribution each with a dominant peak at 60 nm and around 400-450 nm, respectively.

Based on the USAXS data, it is theorized that without sufficient surfactant, the 200 nm PS particles cluster into micrometer-sized assemblies. In such clusters, there are compartments of various sizes filled with water. Water molecules in such micro-compartments experiences different diffusive exchange and local magnetic field gradient than bulk water molecules, which leads to de-coherence of the water proton spin population. As a result, water has anomalously high transverse relaxation rate [22].

To test the proposition that compartmentalization, rather than size heterogeneity per se, leads to anomalously high $R_2(^1H_2O)$, the following control experiment was conducted. All eight particle samples from Example 1 of different sizes, ranging from 30 nm to 10 μm, were mixed at equal volume proportion. The mixture was then diluted by 2×PBS at 1:1 volume ratio, the same as individual suspensions. The $R_2(^1H_2O)$ of the heterogeneous mixture of PS particles was measured at both 0.47 T and 9.4 T and the $R_{2*}(^1H_2O)$ of the heterogeneous mixture of PS particles measured at 9.4 T. Table 1 lists the results. Also listed in Table 1 are the arithmetic average $R_2(^1H_2O)$ and $R_{2*}(^1H_2O)$ of the individual suspensions, wherein the arithmetic average refers to the arithmetic mean of the water proton transverse relaxation rate of individual PS particle suspensions, as well as $R_2(^1H_2O)$ and $R_2*(^1H_2O)$ of the blank buffer which contains no PS particles.

TABLE 1

| | $R_2(^1H_2O)$ of particle mixture and average $R_2(^1H_2O)$ of individual particle samples | | |
|---|---|---|---|
| | Relaxation Rate | | |
| Samples | $R_2(^1H_2O, 9.4T)$ (s$^{-1}$) | $R_2(^1H_2O, 0.47T)$ (s$^{-1}$) | $R_2*(^1H_2O, 9.4\,T)$ (s$^{-1}$) |
| Improperly formulated 200 nm sample | 0.863 ± 0.031 | 0.652 ± 0.008 | 30.17 ± 01.23 |
| Properly formulated 200 nm sample | 0.579 ± 0.021 | 0.556 ± 0.002 | 15.78 ± 1.23 |
| Average$^a$ | 0.568 ± 0.074 | 0.558 ± 0.010 | 14.89 ± 1.10 |
| Mixture$^b$ | 0.545 ± 0.015 | 0.546 ± 0.005 | 14.89 ± 1.23 |
| Buffer | 0.590 ± 0.005 | 0.551 ± 0.001 | 15.40 ± 1.23 |

$^a$Average refers to the arithmetic mean of the water proton transverse relaxation rate of eight individual PS NP suspensions;
$^b$Mixture refers to the water proton transverse relaxation rate of the mixture of PS NPs.

Figure 5:
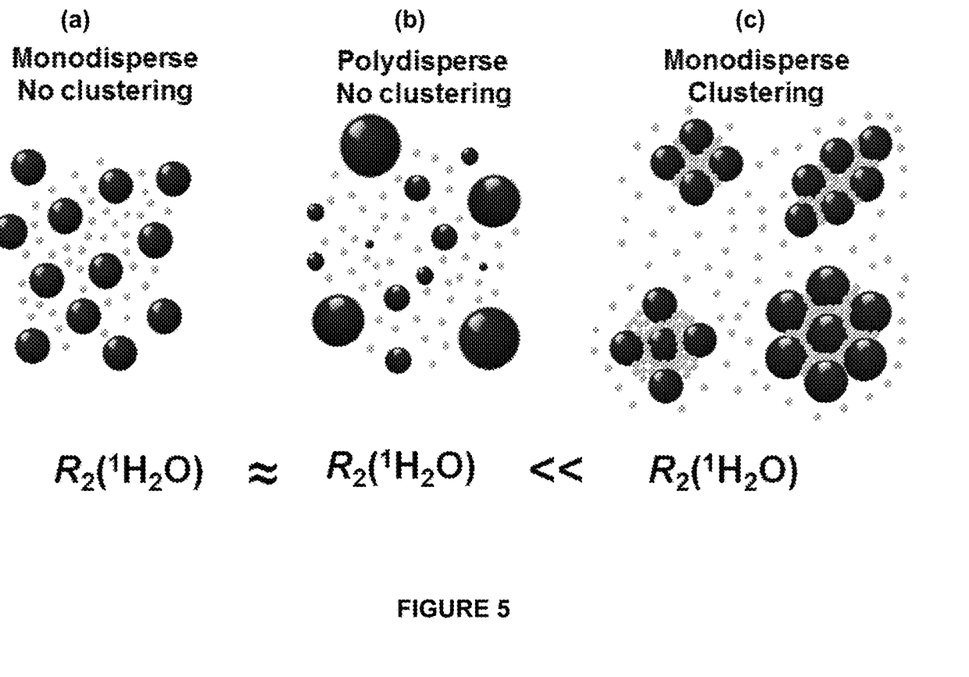
FIG. 5(a) illustrates a properly formulated particle suspension where particles have the same size without clustering.
FIG. 5(b) illustrates a mixture of properly formulated particles suspensions where particles have different sizes but no clustering.
FIG. 5(c) illustrates an improperly formulated particles suspension where the particles have the same size, but form clusters.

From Table 1, it is clear that, within experimental error, the heterogeneous mixture has a $R_2(^1H_2O)$ value no different than the arithmetic average $R_2(^1H_2O)$ of individual particle samples. This result clearly shows that, in the absence of clustering, size heterogeneity per se does not lead to anomalously high transverse relaxation rates. This effect is depicted schematically in FIG. 5, wherein FIG. 5(a) illustrates a properly formulated particle suspension where particles have the same size without clustering, FIG. 5(b) illustrates a mixture of properly formulated particles suspensions where particles have different sizes but no clustering, and FIG. 5(c) illustrates an improperly formulated particles suspension where the particles have the same size, but form clusters. Clustering (e.g., FIG. 5(c)), which inevitably creates micro-compartments for water molecules, is necessary for accelerated transverse spin relaxation while size heterogeneity of PS particles (e.g., FIG. 5(b)) has little effect on the transverse relaxation of water.

EXAMPLE 3

Nanoparticles of iron carbohydrates are approved for treating anemia [23]. They are also used off-label as contrast agents for MRI [24], as an alternative to gadolinium chelates. A very recent study demonstrates that they also possess anti-cancer activities [25]. Hence this class of NBCDs are widely used and their usage is likely to increase. Multiple nanoparticle formulations of iron carbohydrates have gained regulatory approval in the US (e.g., VENEFOR®, FERAHEME®, FERRLECIT®, to name a few). That said, only one generic version has gained approval in the US, with the brand name NULECIT™ or sodium ferric gluconate, which is a follow-on of FERRLECIT®.

Both innovator drug FERRLECIT® and its generic drug NULECIT™ are indistinguishable by their appearance. In both cases, they look like almost nontransparent brownish suspensions, homogenous and uniform, without any inclusions. However, the presence of iron ions in both formulations favors the application of the method of the present invention, since these ions are known to render a noticeable effect on the relaxation rates of the surrounding solvent, especially, in the case of water.

Towards that end, the sensitivity of $R_2(^1H_2O)$ was tested to differentiate between innovator and generic drugs for nanoparticle formulations of iron carbohydrates. Two drugs were compared, innovator drug FERRLECIT® and generic drug NULECIT™, based on the vials that were in the inventors possession. $R_2(^1H_2O)$ of FERRLECIT® and its generic NULECIT™ were measured both at 0.47 T (20 MHz $^1$H resonance frequency) and 9.4 T (400 MHz $^1$H resonance frequency). Analogous to Example 1, the transverse relaxation rate constant $R_2$ of water was measured in CPMG experiments, and transverse relaxation time $T_2$ ($T_2=1/R_2$) was derived using Formula (1), as described above.

TABLE 2

Comparison of water proton relaxation rates $R_2(^1H_2O)$ for FERRLECIT ® and NULECIT ®

| Magnetic Field Strength ($^1$H Resonance Frequency) | $R_2(^1H_2O)$, s$^{-1}$ FERRLECIT ® (innovator) | $R_2(^1H_2O)$, s$^{-1}$ NULECIT ™ (generic) |
|---|---|---|
| 0.47 T (20 MHz) | 23.64 | 16.86 |
| 9.4 T (400 MHz) | 243.90 | 100.00 |

Figure 6:
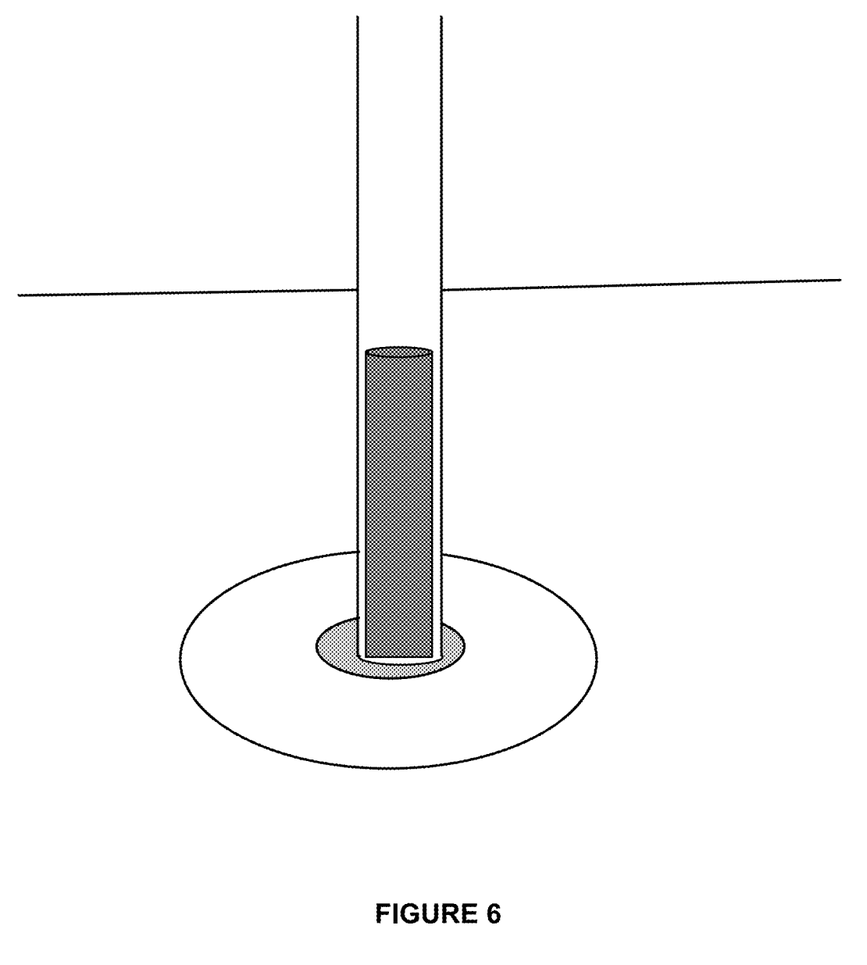
FIG. 6 shows the photo of Ferrlecit® vial inside NMR tube of desktop NMR spectrometer.

As seen from the values listed in Table 2, in both high (9.4 T) and low (0.47 T) magnetic field experiments innovator drug FERRLECIT® had a significantly larger water proton relaxation rate. This demonstrates that water proton transverse relaxation rate, $R_2(^1H_2O)$ can readily distinguish FERRLECIT® and NULECIT™, at least in the vials that the inventors have in their possession. Faster relaxation rate for FERRLECIT® could be due to (1) more labile iron ions in FERRLECIT® as compared to NULECIT™, and/or (ii) larger nanoparticle clusters in FERRLECIT® than in NULECIT™. Both factors are of significant biological and clinical importance for the administration of FERRLECIT® versus NULECIT™. Of note, as seen from FIG. 6, the measurements of water relaxation rate $R_2(^1H_2O)$ in iron carbohydrates formulations in low magnetic field (0.47 T, 20 MHz $^1$H resonance frequency) could be performed noninvasively, without opening the drug vial or removing the aluminum cap. Such noninvasive measurements are possible even if the container is not optically transparent or has a label attached to it.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

REFERENCES

1. Z. Lu, Y. Yin, Colloidal Nanoparticle Clusters: Functional Materials by Design, *Chem. Soc. Rev.*, 2012, 41, 6874-6887.
2. K. Suematsu, Y. Shin, Z. Hua, K. Yoshida, M. Yuasa, T. Kida, K Shimanoe, Nanoparticle Cluster Gas Sensor: Controlled Clustering of SnO$_2$ nanoparticles for Highly Sensitive Toluene Detection, *ACS Appl. Mater. Interfaces*, 2014, 6, 5319-5326.
3. M. De, P. S. Ghosh, V. M. Rotello, Applications of Nanoparticles in Biology, *Adv. Mater.*, 2008, 20, 4225-4241.
4. European Medicines Agency, Reflection paper on non-clinical studies for generic nanoparticle iron medicinal product applications. 2011. http://www.ema.europa.eu/docs/en_GB/document_library/Scientific_guideline/2011/04/WC50010504 8.pdf
5. D. J. A. Crommelin, V. P. Shah, I. Klebovichc, S. E. McNeild, V. Weinsteine, B. Flamannf, S. Muhlebachg, J. S. B. de Vliegeri, The similarity question for biologicals and non-biological complex drugs, *Eur. J. of Pharmaceutical Sci.*, 2015, 76, 10-17.
6. J. Rottembourg, A. Kadri, E. Leonard, A. Dansaert, A. Lafuma, Do two intravenous iron sucrose preparations have the same efficacy? *Nephrology Dialysis Transplantation*, 2011, 26, 3262-3267.
7. H. Schellekens, E. Klinger, S. Mühlebach, J. F. Brin, G. Storm, D. J. Crommelin, Therapeutic equoivalence of complex drugs, *Regol. Toxicol. Pharmacol.*, 2011, 59, 176-183.
8. M. Prashberger, K. Haider, C. Cornelius, M. Schitegg, B. Sturm, H. Goldenberg, B. Schreiber-Mojdehkar, Iron sucrose and ferric carboxymaltose: no correlation between physicochemical stability and biological activity, *Biometals*, 2015, 28, 35-50.
9. S. Fueterrer, I. Andrusenko, U. Kolb, W. Hofmeister, P. Langguth, Structural characterization of iron oxide/hydroxide nanoparticles in nine different parenteral drugs for treatment of iron deficiency anemia by electron diffraction (ED) and X-ray powder diffraction (XRPD), *J. Pharm. Biomed. Analysis*, 2013, 86, 151-160.
10. R B. Shah, Y. Yang, M A. Khan, A. Raw, L X. Yu, P. J. Faustino, Pharmaceutical characterization and thermodynamic stability assessment of a colloidal iron drug product: iron sucrose, *Int. J. Pharmaceutics*, 2014, 464, 46-52.
11. Y. Wu, P. Petrochenko, L. Chen, S. Y. Wong, M. Absar, S. Choi, J. Zheng, Core size determination and structural characterizatio of intravenous iron complexes by cryogenic transmission electron microscopy, *Int. J. Pharm.*, 2016, 505, 167-174.
12. S. C. Hock, Y. M. Ying, C. L. Wah, A Review of the Current Scientific and Regulatory Status of Nanomedicines and Challenges Ahead, *PDA J. Pharm. Sci. Technol.*, 2011, 65, 177-195.
13. F. Zhang, A. J. Allen, L. E. Levine, J. Ilavsky, G. G. Long, Structure and Dynamics Studies of Concentrated Micrometer Sized Colloidal Suspensions, *Langmuir*, 2013, 29, 1379-1387.
14. P. Akcora, H. Liu, S. K. Kumar, J. Moll, Y. Li, B. C. Benicewicz, L. S. Schadler, D. Acehan, A. Z. Panagiotopoulos, V. Pryamitsyn, V. Ganesan, J. Ilavsky, P. Thiygarajan, R. H. Colby, J. F. Douglas, Anisotropic Self-Assembly of Spherical Polymer-Grafted Nanoparticles, *Nature Mater.*, 2009, 8, 354-359.
15. K. Alexander, R. Azencott, B. G. Bodmann, A. Bouamrani, C. Chiappini, M. Ferrari, X. Liu, E. Tosciotti, SEM Image Analysis for Quality Control of Nanoparticles, in *Computer Analysis of Images and Patterns*, ed. X. Jiang and N. Petkov, Springer, Berlin-Heidelberg, 2009, pp. 590-597.
16. J. Karolin, C. D. Geddes, Nanoparticle Sizing and Potential Quality Control of Sols Using Unique Fluorescence Anisotropy Probes and 3D Contour Anisotropy Mapping, *J. Phys. Chem. Lett.*, 2015, 6, 918-922.
17. Metz, H.; Mader, K., *Int. J. Pharm.* 2008, 364, 170-178.
18. M. B. Taraban, H. C. Truong, Y. Feng, E. V. Jouravleva, M. A. Anisimov, Y. B. Yu, Water Proton NMR for In Situ Detection of Insulin Aggregates, *J. Pharm. Sci.*, 2015, 104, 4132-4141.
19. Y. Feng, M. B. Taraban, Y. B. Yu, Water Proton NMR—A Sensitive Probe for Solute Association, *Chem. Commun.*, 2015, 51, 6804-6807.
20. B. Cowan, *Nuclear Magnetic Resonance and Relaxation*, Cambridge University Press, Cambridge, 1997.

21. J. Ilaysky, P. R. Jemian, Irena: Tool Suite for Modeling and Analysis of Small-Angle Scattering, *J. Appl. Cryst.*, 2009, 42, 347-353.
22. B. P. Hills, K. M. Wright, P. S. Belton, NMR Studies of Water Proton Relaxation in Sephadex Beads Suspensions, *Mol. Phys.*, 1989, 67, 193-208.
23. M. Auerbach, H. Ballard, Clinical use of intravenous iron: administration, efficacy, and safety, *Hematology*, 2010, 338-347.
24. M. Bashir, L. Bhatti, D. Marin, R. C. Nelson, Emerging applications for ferumoxytol as a contrast agent in MRI, *J. Magn. Reson. Imag.*, 2015, 41, 884-898.
25. S. Zanganeh, G. Hutter, R. Spitler, O. Lenkov, M. Mahmoudi, A. Shaw, J. S. Pajarinen, H. Nejadnik, S. Goodman, M. Moseley, L. M. Coussens, H. E. Daldrup-Link, Iron oxide nanoparticles inhibit tumour growth by inducing pro-inflammatory macrophage polarization in tumour tissues, *Nat. Nanotechnol.*, 2016, 11, 986-994.
26. FDA. Solicitation Number: FDA-SOL-1120929 "Evaluate the therapeutic equivalence of generic sodium ferric gluconate iron complex Nulecit™ and its RLD Ferrlecit®," https://www.fbo.gov/index?s=opportunity&mode=form&id=4ff6dcf9ec53803a96430d87b79425ef&ta b=core&_view=0

What is claimed is:

1. A method of non-destructively determining whether clustering of particles in a particle-containing product is acceptable, wherein the particle-containing product is contained in a vial, said method comprising:
measuring a transverse relaxation rate of solvent $R_{2,m}$ in the particle-containing product, wherein no additives or probes are added to the vial prior to the measurement; and
comparing the measured $R_{2,m}$ to a control transverse relaxation rate of solvent $R_{2,c}$, wherein the control $R_{2,c}$ represents a range of acceptable clustering,
wherein when the measured $R_{2,m}$ is inside the control $R_{2,c}$ range, the amount extent of clustering is acceptable.

2. The method of claim 1, wherein the $R_{2,m}$ is measured using nuclear magnetic resonance (NMR).
3. The method of claim 1, wherein the $R_{2,m}$ can be measured without opening the vial containing the particle-containing product or otherwise accessing the contents of the vial containing the particle-containing product.
4. The method of claim 1, wherein the solvent is water.
5. The method of claim 1, wherein the particle-containing product comprises particles in a range from about 1 nanometer and 10 microns in diameter.
6. The method of claim 1, wherein the particles in the particle-containing product are nanoparticles.
7. The method of claim 1, wherein the particle-containing product comprises organic particles, inorganic particles, organometallic particles, proteinaceous particles, metallic particles, polymeric particles, or any combination of each of these.
8. The method of claim 1, wherein clustering is not driven by hydrophobic and/or hydrophilic interactions and does not involve the transfer of any protons.
9. The method of claim 1, wherein acceptable clustering indicates that the particle-containing product can be used or distributed as intended.
10. The method of claim 1, wherein the particle-containing product is measured during pre-formulation, formulation, production, or post-production.
11. The method of claim 1, wherein when the measured $R_{2,m}$ is outside the control $R_{2,c}$ range, the amount of clustering is unacceptable, which may be caused by at least one of (i) improper formulations, (ii) the effect of temperature fluctuations on the particle-containing product, (iii) pH changes, (iv) vigorous shaking during transportation; (v) freezing; and/or (vi) unwanted functional groups on the surface of particles.
12. The method of claim 1, wherein the method is used to determine unacceptable clustering when clustering is not favored or acceptable clustering when clustering is favored.

* * * * *

UNITED STATES PATENT AND TRADEMARK OFFICE
CERTIFICATE OF CORRECTION

PATENT NO. : 11,346,908 B2
APPLICATION NO. : 16/465290
DATED : May 31, 2022
INVENTOR(S) : Yu et al.

It is certified that error appears in the above-identified patent and that said Letters Patent is hereby corrected as shown below:

In the Claims

Claim 1, Column 17, Line 38 reads:
"…range, the amount extent of clustering is acceptable."
Whereas it should read:
"…range, the amount of clustering is acceptable."

Signed and Sealed this
Twelfth Day of July, 2022

Katherine Kelly Vidal
*Director of the United States Patent and Trademark Office*